United States Patent
Takeuchi et al.

[11] Patent Number: 6,051,171
[45] Date of Patent: Apr. 18, 2000

[54] METHOD FOR CONTROLLING FIRING SHRINKAGE OF CERAMIC GREEN BODY

[75] Inventors: Yukihisa Takeuchi, Nishikamo-gun; Tsutomu Nanataki, Toyoake; Hisanori Yamamoto; Katsuyuki Takeuchi, both of Nagoya, all of Japan

[73] Assignee: NGK Insulators, Ltd., Nagoya, Japan

[21] Appl. No.: 09/080,293

[22] Filed: May 18, 1998

Related U.S. Application Data

[63] Continuation-in-part of application No. 08/538,413, Oct. 2, 1995, Pat. No. 5,753,160.

[30] Foreign Application Priority Data

Oct. 19, 1994 [JP] Japan ................................. 6-253858

[51] Int. Cl.$^7$ .............................. B29C 7/04; G01B 7/04; F27B 9/04
[52] U.S. Cl. .......................................... 264/40.1; 264/620
[58] Field of Search ................................... 264/681, 40.1, 264/40.4, 620; 501/102, 103, 105, 153, 127

[56] References Cited

U.S. PATENT DOCUMENTS

| | | | |
|---|---|---|---|
| 2,893,102 | 1/1959 | Maxwell et al. | 25/156 |
| 4,341,725 | 7/1982 | Weaver et al. | 264/28 |
| 4,772,576 | 9/1988 | Kimura et al. | 501/105 |
| 4,774,211 | 9/1988 | Hamilton et al. | 501/153 |
| 5,002,909 | 3/1991 | Montino et al. | 501/105 |
| 5,238,627 | 8/1993 | Matsuhisa et al. | 264/63 |
| 5,338,713 | 8/1994 | Takagi et al. | 501/105 |
| 5,505,865 | 4/1996 | Kumar et al. | 252/62.62 |
| 5,733,499 | 3/1998 | Takeuchi et al. | 264/650 |
| 5,753,160 | 5/1998 | Takeuchi et al. | 264/40.1 |

FOREIGN PATENT DOCUMENTS

| | | |
|---|---|---|
| 0 133 509 A3 | 2/1985 | European Pat. Off. . |
| 0 345 022 A1 | 12/1989 | European Pat. Off. . |
| 0 406 578 A2 | 1/1991 | European Pat. Off. . |
| 5-82339 B2 | 11/1993 | Japan . |

*Primary Examiner*—Stanley S. Silverman
*Assistant Examiner*—Jacqueline A. Ruller
*Attorney, Agent, or Firm*—Kubovcik & Kubovcik

[57] ABSTRACT

A method of controlling the amount of firing shrinkage of a ceramic green body prepared by molding a ceramic powder (A) to a desired value $A_1$ by heat treating the powder at a temperature $T_1$ that provides the firing shrinkage $A_1$ at a predetermined firing temperature. The temperature $T_1$ is determined based on an established correlation between an amount of firing shrinkage at the predetermined firing temperature and a heat-treatment temperature of a powder (B) having a composition similar to that of the powder (A) in such an extent that a total amount of a greatest common content of an individual component common between the powders (A) and (B) in terms of percent is 90% by weight or more, and satisfying such a relation that the spherical diameter of powder (A) is within a range of ± 30% relative to the spherical diameter (Rs) of the powder (B) and that its average degree of aggregation (x) is within the range from ½ fold to 2 fold relative to the average degree of aggregation (x) of the powder (B).

3 Claims, 1 Drawing Sheet

METHOD FOR CONTROLLING FIRING SHRINKAGE OF CERAMIC GREEN BODY

This is a continuation-in-part of U.S. Ser. No. 538,413 filed Oct., 2, 1995, now U.S. Pat. 5,753,160, issued May 19, 1998.

BACKGROUND OF THE INVENTION AND RELATED ART STATEMENT

The present invention relates to a method for controlling a rate of shrinkage caused upon firing a ceramic green body. More particularly, the present invention relates to a method for controlling a rate of firing shrinkage of a ceramic green body by adjusting properties of a raw material made of ceramic powders.

In producing a ceramic product, controlling a rate of firing shrinkage of a ceramic green body has conventionally been important for improving size precision and shape precision and avoiding a shape defect or the like of a final ceramic product.

Particularly, multilayered ceramic substrates have recently been used upon producing electronic parts such as IC and condenser. Since such electronic parts are required to be put under a precise size and shape control, it is very important to precisely control a firing shrinkage of a green sheet which constitutes such a multilayered ceramic substrate.

As methods for controlling firing shrinkage of a green sheet, some methods have been known. In one method, a mixing time is adjusted so as to adjust a particle size of ceramic powders when a slurry is prepared by mixing ceramic powders, a binder, a plasticizer, a dispersant, a solvent, and the like. Another method is that an amount of a binder is adjusted. There is still another method in which a highest temperature, a retention time, an atomspheric composition, and a gas flow amount are adjusted. Further, Japanese Patent Publication 5-82339 discloses yet another method in which ionic impurities are added to a slurry of a ceramic oxide.

However, these conventional methods have some problems. The first method in which a mixing time is adjusted has a problem that a homogenous slurry cannot be obtained because of insufficient mixing of ceramic powders, a binder, and the like when the mixing time is too short. On the other hand, when the mixing time too long, a flowability of a slurry deteriorates, and a slurry sometimes becomes pudding-like. Further, since a time of mixing contributes less to the control of firing shrinkage as the time of mixing becomes longer, an intended effect cannot be obtained even if the materials are mixed for a long time.

In the method in which an amount of a binder is adjusted, strength of a green sheet decreases and handling convenience deteriorates when the amount of a binder is too small. When the amount is too large, binder can hardly be removed, which makes not only a problem that a fired body is prone to have a shape defect such as bulging on the fired body, but also a problem that the fired body is hardly densified.

Further, in the method in which ionic impurities are added, besides the decrease of strength of a fired body, electrical characteristics such as electric conductivity, permittivity, dielectric loss, etc., are changed.

In the method in which firing conditions are adjusted, a fired body is hardly densified. Besides, strength of a fired body decreases because crystalline particles grow, and properties of the fired body are prone to be changed.

The present invention was made in consideration of such conventional problems.

The present inventors have earnestly studied and found that a method for controlling a firing shrinkage with a great preciseness can be provided by adjusting a spherical diameter of ceramic powder, heating the ceramic powder at a specific temperature, and then molding and firing the ceramic powder, which led to a completion of the invention disclosed in U.S. patent application Ser. No. 538,413 filed Oct. 2, 1995, now U.S. Pat. No. 5,753,160 issued May 19, 1998.

However, such a case that a powder used for molding the composition of a ceramic green body coincides with that of a powder used to obtain a correlation for controlling firing shrinkage of the ceramic green body is not necessarily frequent during production. Particularly, modification of a property of the fired body according to a request from a user requires to mix of other components depending on the property, which makes the work for obtaining the correlation very complex. Thus, the method had disadvantages of high production cost, etc.

Though a correlation present between materials having the same composition was tentatively applied to such a case, the obtained fired body showed that a firing shrinkage of the green body not always be controlled as desired.

SUMMARY OF THE INVENTION

The present invention has been made in view of such conditions and on the basis of findings that a firing shrinkage can be controlled to be within a desired range by the use of a correlation obtained by using a powder used for obtaining the correlation (hereinbelow referred to as powder B) as long as a powder used for molding a ceramic green body (hereinbelow referred to as powder A) and the powder B satisfies the following requirements even if the powder A does not have the same composition as the powder B.

1. Each of the powders A and B has a spherical diameter Rs of 1 $\mu$m or less, and the spherical diameter of the powder A is within ±30% or less of that of the powder B.

2. A total amount of a greatest common content of the respective components common to the powders A and B is 90 wt % or more.

3. An average degree of aggregation ($\underline{x}$) of each of the powders A and B is within the range from 2 to 10, and a ratio of an average degree of aggregation of the powder A to that of the powder B is within the range from 1:2 to 2:1.

The expression "a total amount of a greatest common content of an individual component common between powders A and B" hereinafter referred to means the total amount of the contents of the components common between powders A and B which is an accumulative value of the smaller figure in terms of percent between the two powders A and B in the contents of the components common between the powders A and B.

In a method for controlling a firing shrinkage of a ceramic green body of the present invention, a ceramic powder is subjected to a pretreatment in the same manner as the case that the powder A and powder B have the same composition. By the pretreatment, a spherical diameter (Rs) of the ceramic powder is adjusted to be 1 $\mu$m or less, wherein Rs is expressed by an equation of Rs($\mu$m)=6/$\rho$S, in which S and $\rho$ denote the same meanings as mentioned above. One may choose a ceramic powder capable of satisfying the Rs value as defined above from the commercial available ones. One may obtain a ceramic powder capable of satisfying the Rs value as defined above by mixing at least two ceramic powders having Rs values that differ from each other.

Then, the powder subjected to the pretreatment is measured for an average degree of aggregation.

It is necessary that an average degree of aggregation of each of the powders A and B is within the range from 2 to 10. If one of the powders A and B has an average degree of aggregation outside the range, the average degree of aggregation can be easily adjusted by mixing a pretreated powder therein so as to bring it within the aforementioned range.

When it is tried to find a correlation between the powder A and the powder B, an average degree of aggregation of the powder A and/or B are/is adjusted so that an average degree of aggregation of the powder A is within the range from ½ fold to 2 fold relative to that of the powder B.

Thus prepared ceramic powder (A) is subjected to a heat treatment at a specific temperature calculated in advance, the ceramic powder is molded to obtain a ceramic green body, and the ceramic green body is fired, successively to obtain a correlation between powders A and B.

In the present invention, firing shrinkage of a ceramic green body is controlled by adjusting properties of a ceramic powder itself so as to satisfy the above conditions by subjecting the ceramic powder to the aforementioned pretreatment and the heat treatment.

A firing shrinkage of a ceramic green body can be controlled even if the powders A and B have mutually different compositions as long as the powders A and B have a certain relation.

For example, the firing shrinkage of several ceramic green substrates having different compositions to be used to fabricate a complicated electronic part such as a multilayer substrate made of such substrates can be controlled by using a correlation obtained by using a ceramic powder having a specified relation with the powders used to mold said ceramic green substrates. Thus, one may control the firing shrinkage of a multilayer green substrate made of several ceramic powders having different compositions from each other. Furthermore, one may control the structure of a multilayer substrate itself of that of electronic parts produced by using such a multilayer substrate.

DETAILED DESCRIPTION OF THE INVENTION

Figure 1:
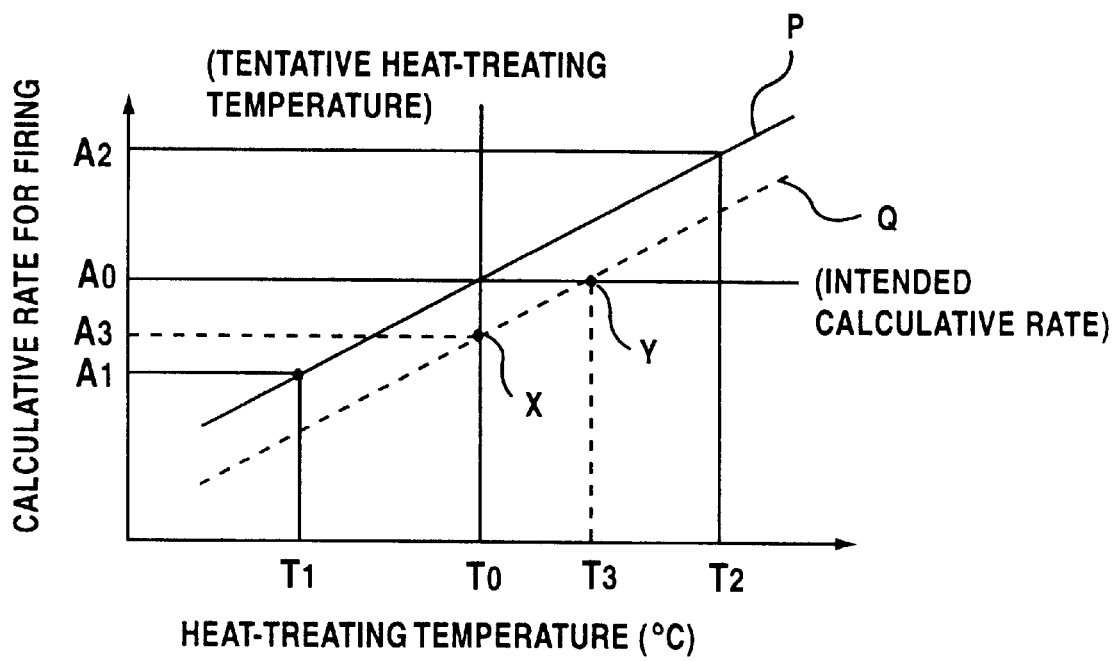
FIG. 1 is a chart showing a correlation of a temperature of thermal treatment and a calculative rate for firing.

The present invention is hereinbelow described in more detail.

In the first place, a ceramic powder is subjected to pre-treatment so as to obtain a ceramic powder having a spherical diameter (Rs) of 1 $\mu$m or less. Rs is expressed by an equation of Rs($\mu$m)=6/$\rho$S. Here, $\rho$ means a true density (g/cm$^3$) of a ceramic powder, and S means a BET specific surface area (m$^2$/g).

Incidentally, a true density $\rho$ of a ceramic powder shows a theoretical density. For example, a partially stabilized zirconia powder containing 3 mol % (5.4 wt %) of yttria has a true density $\rho$ of 6.10 g/cm$^3$, and an alumina powder has a true density $\rho$ of 3.98 g/cm$^3$.

When Rs value exceeds 1 $\mu$m, the heat treatment in the next step does not work effectively. To control a firing shrinkage precisely, the Rs value is preferably 0.5 $\mu$m or less, more preferably 0.2 $\mu$m or less. Additionally, when the Rs value is less than 0.01 $\mu$m, the influence on ceramic green bodies during heat treatment is so hypersensitive that the firing shrinkage becomes unstable due to the fluctuation of the temperature during heat treatment, the unevenness of temperature during the heat treatment or the like. Therefore, the Rs value is preferably 0.01 $\mu$m or more, more preferably 0.05 $\mu$m or more.

It is required to adjust the Rs value of the powder A relative to the Rs value of the powder B to be within ±30% by choosing either powder A or power B so as to satisfy the said requirement as to the relative Rs value.

Examples of the aforementioned pretreatment are heating, mixing, grinding, calcining, synthesizing, and any combination of them. However, a preferable pretreatment is grinding a calcined powder to adjust a value of Rs, followed by a heat treatment.

Besides such pretreatments, a ceramic powder having a predetermined value of Rs is obtained by selecting ceramic powders which satisfy the aforementioned value of Rs from the commercially available ceramic powders.

Each of the powders A and B is required to have an average degree of aggregation within the range from 2 to 10.

Average degree of aggregation means a value obtained by dividing by Rs a median diameter Rm obtained by a laser scattering method by the use of a ceramic powder subjected to a pretreatment.

The measurement of median diameter Rm can be performed by precisely weighing 50 mg of a ceramic powder to be measured, placing this powder in a container together with 30 ml of an aqueous solution containing 0.2% of hexametaphosphate sodium, dispersing the powder by subjecting the resultant composition to homogenizer treatment, and measuring the Rm of the powder with a laser diffraction/scattering type particle distribution determination apparatus La-700 produced by Horiba Seisakusho.

An average degree of aggregation is preferably 10 or less. When it exceeds 10, it is not preferable in view point of precision in control. This is because defects such as variance in thickness and cracks are prone to be caused in a green sheet obtained from the powder, thereby causing variance in firing shrinkage rate. Additionally, since influence by the heat treatment becomes hypersensitive, variance in firing shrinkage rate by fluctuation of a temperature during the heat treatment, or the like occurs.

Further, an average degree of aggregation is preferably 2 or more. This is because the heat treatment does not work effectively on the powder. Particularly, when it is about 1 or less, particles in the powder are prone to have not a spherical shape but a flat shape or an asymmetric shape such as a discoid shape and a needle-like shape. Therefore, when a green body such a green sheet is produced, particles are orientated, and thereby anisotropy in firing shrinkage is prone to be caused.

Further, an average degree of aggregation of the powder to be controlled is preferably within the range from ½ fold to 2 fold, and more preferably from ⅔ fold to 3/2 fold relative to that of the powder obtaining a correlation. This is because a parallel property of two correlative lines is enhanced.

Rs value and an average degree of aggregation can be controlled by subjecting the powder to dry grinding/wet grinding by the use of various kinds of grinders with changing grinding conditions and/or grinding time besides selection of an initial material powder in which the aforementioned property is adjusted to have an intended value.

Components of the powders to be used are not particularly limited and may be selected form ceramics such as alumina, zirconia, ceria, yttria, silica, magnesia, titania, calcia, ytterbia, spinel, beryllia, mullite, silicon nitride, aluminum nitride, silicon carbide, or a mixture thereof. The powders may be used in a condition of solid solution. These components may be crystalline or amorphous like glass. Further, metals having a high melting point such as tungsten and molybdenum or metals having corrosion resistance such as platinum, palladium, and silver besides ceramic components may be contained. These metals may be used singly or in combination.

The compositions of the powder A and the powder B are similar to each other, and they satisfy the following requirements.

A greatest total content of the respective components common to the powders A and B is preferably 90 wt % or more, more preferably 95 wt % or more. This is because a parallel property of two correlative lines is enhanced when the greatest total content common to the two powders is 95 wt % or more.

Furthermore, each of the aforementioned powders preferably contains zirconia and/or alumina as a main component, and a greatest total content of zirconia and/or alumina common to the powders A and B is preferably 75 wt % or more. This is because a parallel property of two correlative lines is enhanced when the rate is 75 wt % or more.

Then, thermal treatment, a characteristic of the present invention, is hereinbelow described.

The heat treatment is conducted before molding and firing a ceramic powder by maintaining the ceramic powder at a predetermined temperature for a certain period of time. The predetermined temperature can be calculated according to the following manner.

(1) Firstly, a ceramic powder used for obtaining the correlation (a ceramic powder B) is selected, taking into consideration the aforementioned requirements.

That is, the ceramic powder B is selected so as to meet the requirements as to the Rs value, the average degree of aggregation and the greatest common content of the respective components common to a ceramic powder used for molding a ceramic green body (a ceramic powder A). For example, Rs value of the ceramic powder to be used for an actual manufacturing of product (powder A) is preferably within ±30%, more preferably ±10%, of Rs value of the ceramic powder to be used for obtaining the correlation (powder B) because a parallel property of two correlative lines of the powders A and B is enhanced. A similar thing is also applicable to the relation between powders A and B as to the average degree of aggregation.

The ratio of an average degree of aggregation of the powder A (a powder to be used for actual manufacturing of a product) to that of the powder for obtaining the correlation (powder B) should be within the range from 1:2 to 2:1, preferably from 2:3 to 3:2.

Such an arbitrary selected ceramic powder is subjected to a thermal treatment at more than one arbitrary selected temperature, then subjected to molding and firing which are planned in an actual manufacturing so as to obtain the rate of firing shrinkage in the case. The obtained rate of firing shrinkage is expressed as a calculative rate for firing specified by the equation: Calculative rate for firing=Dimensions before firing/Dimensions after firing.

Then, a correlation between the rates and the arbitrarily selected temperatures is obtained. If the calculative rates for firing are $A_1$ and $A_2$ respectively and if $T_1$ is not so distant from $T_2$ when the aforementioned temperatures which are arbitrarily selected are T1 and T2, the correlation between the treating temperatures and the rates of firing shrinkage can be expressed as the straight line P in FIG. 1.

(2) Next, a calculative rate for firing corresponding to an intended rate of firing shrinkage and a tentative treating temperature corresponding to the calculative rate for firing are obtained, based on the correlation between the treating temperatures and the rates of firing shrinkage.

For example, in FIG. 1, the calculative rate for firing $A_0$ corresponding to an intended rate for firing shrinkage is selected. A tentative heat treatment temperature for the powder A "$T_0$" is supposedly taken to be equal to the heat treatment temperature for the powder B "$T_0$" determined by the value of $A_0$ and the straight line P.

In this case, the tentative treating temperature $T_0$ for the powder B is expressed by the following equation:

$$T_0=T_1+(T_2-T_1)\times(A_0-A_1)/(A_2-A_1) \ldots \quad (1)$$

When the gradient of the straight line P is expressed by R, R satisfies the following equation:

$$R=(A_2-A_1)/(T_2-T_1) \ldots \quad (2)$$

From the equations (1) and (2), $T_0$ is expressed by the following equation:

$$T_0=T_1+(1/R)\times(A_0-A_1) \ldots \quad (3)$$

(3) Then, a ceramic powder A of which firing shrinkage is to be controlled by taking the heat treatment temperature for the powder B "$T_0$" as a tentative heat treatment temperature for the powder A "$T_0$" and which satisfies the aforementioned requirements inclusive of a relation to the powder B is subjected to heat treatment at the tentative treating temperature obtained in the aforementioned manner. Then, the powder is subjected to molding and firing to obtain a tentative calculative rate for firing.

For example, in the example shown in FIG. 1, the ceramic powder is heated at a tentative heating temperature ($T_0$), and then molded and fired, by which a tentative calculative rate for firing ($A_3$) is obtained. Indeed, the tentative heat treatment treatment temperature "$T_0$" for the powder A.

The predetermined treating temperature $T_3$ is expressed by the following equation:

$$T_3=T_0+(T_2-T_1)\times(A_0-A_3)/(A_2-A_1) \ldots \quad (4)$$

From the equation (4) and the aforementioned equation (2), the following equation (5) can be obtained.

$$T_3=T_0+(1/R)\times(A_0-A_3) \ldots \quad (5)$$

For the calculation of a predetermined treating temperature as described in the above (1)–(5), the example shown in FIG. 1 employed only two temperatures of $T_1$ and $T_2$ as treating temperatures for the ceramic powder B. However, the treating temperatures are not limited to two temperatures, and more than two temperatures may be employed. By using many points of temperatures, a firing shrinkage can be controlled more precisely.

Though the control is influenced by a difference in composition between the ceramic powders A and B to be used, employing two or three points of treating temperatures are usually satisfactory.

Further, in the example shown in FIG. 1, the correlation between treating temperatures of the ceramic powder B and calculative rates for firing is represented by a straight line P. However, it is not limited to a straight line, and even if the correlation is expressed by a secondary regression curve, a cubic curve, . . . , or a curve of n dimensions, a predetermined treating temperature can be calculated in a mathematical manner. The dictation of offsetting a line for correlation is to the direction of the y axis (the axis showing the firing shrinkage).

Particularly, when numerous temperatures for thermal treatment are adopted, a higher correlation is obtained by adopting a curve of multiple degree such as a curve of secondary degree.

In order to control firing shrinkage rate excellently, the aforementioned correlative line is required to have an adequate inclination and to be obtained with good reproducibility. The aforementioned inclination means the inclination which does not fall under the followings: When the inclination is 0, firing shrinkage rate cannot be controlled. When the inclination is less than $1 \times 10^{-6}(1/°\text{ C.})$, a width of firing shrinkage rate to be controlled is too limited when a temperature range where the heat treatment is effectively worked. Therefore, the inclination is preferably $1 \times 10^{-6}(1/°\text{ C.})$ or more (absolute value), and more preferably $5 \times 10^{-6}(1/°\text{ C.})$ or more (absolute value). On the contrary, when the inclination exceeds $1 \times 10^{-6}(1/°\text{ C.})$ (absolute value), influence by the heat treatment is hypersensitive, and stability of firing shrinkage rate cannot be obtained because of fluctation of a temperature the heat treatment or unevenness of temperature during heat treatment. Therefore, the inclination is preferably $1 \times 10^{-3}(1/°\text{ C.})$ or less (absolute value).

Figure 2:
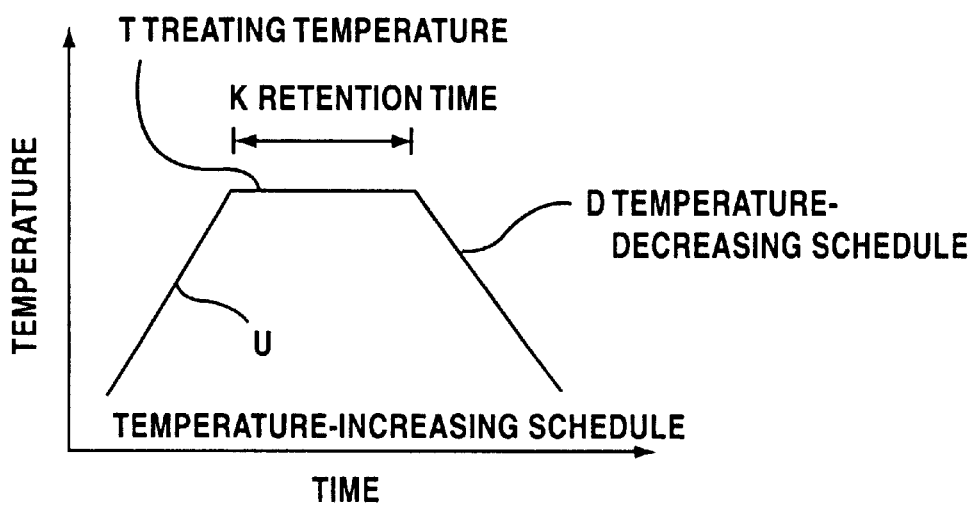
FIG. 2 is a chart showing a process of a heat treatment.

The aforementioned treatment can be represented by the process shown in FIG. 2.

Among the factors constituting the process, the treating temperature T is the most influential factor in controlling a firing shrinkage. As the treating temperature T is higher, the aforementioned calculative rate for firing becomes higher.

The treating temperature T can be calculated in the aforementioned manner of (1)–(5). A temperature range to be employed is from a range of a low temperature at which an surface activity of a ceramic powder starts changing to a range of a high temperature at which a diameter of a crystalline particle of a ceramic powder starts growing. For example, in the case of a partially stabilized zirconia having an Rs value of 0.15, it is preferably heated at a temperature ranging from 300° C. to 1200° C., more preferably from 400° C. to 1000° C. When the treating temperature is within this range, the influence in sintering property of a ceramic product is decreased.

With regard to the relation between the treating temperature and a firing temperature for an actual manufacturing of a ceramic product, the treating temperature T is preferably within the range of 20–85% more preferably 30–75%, of the firing temperature from the viewpoint of controlling firing shrinkage more precisely. When the treating temperature is lower than 20% of the firing temperature, firing shrinkage cannot be effectively controlled. When the treating temperature is higher than 85% of the firing temperature, sintering of a ceramic powder proceeds, which makes the handling of the powder difficult as a powder for molding.

Another factor which is influential in controlling a firing shrinkage is a keeping time K. When the keeping time K becomes long, the calculative rate for firing tends to become large. However, the rate of the influence of the keeping time K is smaller than that of the treating temperature T.

When a large amount of a ceramic powder is heated and the keeping time K is short, it sometimes happens that the ceramic powder is not uniformly heated, which may cause unevenness of firing shrinkage. Therefore, when a large amount of ceramic is used, the keeping time K is preferably long to some degree.

Since a temperature-increasing schedule U and a temperature-decreasing schedule D have little influence on the firing shrinkage, various kinds of modes, for example, quick heating, quenching, gradual cooling, etc., can be applied.

Incidentally, heat treatment may be performed in any of various kinds of atmosphere, such as an oxidizing atmosphere, a neutral atmosphere, a reducing atmosphere, or under reduced pressure. When a thermally treating atmosphere is prepared by circulating a gas, an amount of the gas is not particularly limited.

Next, an influence of the aforementioned heat treatment on a ceramic powder will be described.

The details of the influence of the heat treatment on a ceramic powder is not obvious. However, it can be considered at this point of time that heat treatment having an effect of adjusting a density of a ceramic green body ranges from a temperature at which only activity of the surface of a ceramic powder changes, i.e., a temperature at which a value of specific surface area and a diameter of a crystalline do not change, to a temperature at which grain size of a ceramic powder starts changing, i.e., a temperature at which specific surface area starts decreasing and a diameter of a crystalline starts increasing.

The rates of changes of a specific surface area and a diameter of a crystalline by the aforementioned heat treatment is smaller than that by a calcination.

For reference, Tables 1 and 2 show a change of a specific surface area and a change of a diameter of a crystalline when a partially stabilized zirconia is subjected to heat treatment.

Incidentally, in Table 2 a diameter of a crystalline was measured by X-ray diffraction method and calculated by the following equation:

$$D = K/\beta \cos\theta$$

(In the equation, D means a diameter of a crystalline (angstrom), K is a constant and is a wavelength of X-ray (angstrom), β is a width of a diffraction line (radian), and θ means an angle of diffraction. K is 0.9 if a peak width at half height is used for β).

TABLE 1

Example of a partially stabilized zirconia powder obtained by coprecipitation method:

| | | Temperature for Heat Treatment*[1](° C.) | | | | | |
|---|---|---|---|---|---|---|---|
| | | No heat treatment | 500 | 600 | 700 | 900 | 1000 |
| Specific Surface Area | Sample 1 ($m^2$/g) | 7.4 | 7.4 | 7.4 | 7.4 | 6.6 | 5.9 |
| | Sample 2 ($m^2$/g) | 16.5 | 16.5 | 15.9 | 15.3 | 13.1 | 11.0 |
| Rate of Change*[2] | Sample 1 (–) | 1.0 | 1.0 | 1.0 | 1.0 | 0.89 | 0.80 |
| | Sample 2 (–) | 1.0 | 1.0 | 0.96 | 0.93 | 0.79 | 0.67 |

*[1] 6 hours
*[2] Specific surface are after heat treatment/Specific surface before heat treatment

TABLE 2

| | Temperature for Heat Treatment*[1] | | | | |
|---|---|---|---|---|---|
| | No heat treatment | 500° C. | 600° C. | 900° C. | 1000° C. |
| Partially stabilized zirconia (Specific surface area of 16.5 m²/g) | | | | | |
| Diameter of crystallite of M phase*[2] (angstron) | 190 | 200 | 200 | 240 | 280 |
| Diameter of crystallite of T phase*[3] (angstron) | 240 | 230 | 240 | 280 | 330 |
| Rate*[4] of change of diameter of crystallite (M phase) | 1.0 | 1.05 | 1.05 | 1.26 | 1.47 |
| Rate of change of diameter of crystallite (T phase) | 1.0 | 0.96 | 1.0 | 1.17 | 1.38 |
| Partially stabilized zirconia (Specific surface area of 7.4 m²/g) | | | | | |
| Diameter of Crystallite of M phase (angstrom) | 350 | 350 | 350 | 350 | 370 |
| Diameter of Crystallite of T phase (angstrom) | 400 | 400 | 400 | 400 | 430 |
| Rate of change of diameter of crystallite (M phase) | 1.0 | 1.0 | 1.0 | 1.0 | 1.06 |
| Rate of change of diameter of crystallite (T phase) | 1.0 | 1.0 | 1.0 | 1.0 | 1.08 |

*[1]6 hours
*[2]Monoclinic system
*[3]Tetragonal system
*[4]Diameter of crystallite after heat treatment/Diameter of crystallite before heat treatment A heat treatment which is a characteristic of the method for controlling firing shrinkage according to the present invention has been described. In the method of the present invention, a ceramic powder is subjected to the aforementioned pretreatment and the aforementioned heat treatment, and then subjected to molding and firing which is described hereinbelow.

The molding and firing methods are not limited, and various kinds of methods which have conventionally been known can be applied.

For example, regarding molding, there can be used a wet method in which a slurry is prepared for molding a green sheet or a dry method such as press molding. However, it is preferable that the powder A and the powder B are molded in the same manner.

In the aforementioned two methods for molding the powders, the wet method is more preferable in view of precision in control. The reason is as follows: In the dry method, a ceramic powder or the like is filled in a mold. Since a pressure does not spread uniformly in a press step, rate of gaps present in a molded body is prone to show variance. Because of this, a firing shrinkage rate is prone to show variance. On the other hand, since a wet method does not contain the aforementioned step, rate of gaps present in a molded body is more uniform in comparsion with a dry method.

Organic resins such a binder, plasticizer, and dispersant and additives such as solvent have no particular limitation on kind and amount. However, it is preferable to use same kinds for the two powders in view of precision in control. An amount of the organic resins to be added is preferably ±30 wt %, more preferably ±10 wt %. A ratio of the aforementioned rate is desirably the same between the powders A and B in view of precision in control. Similarly, an amount of a solvent to be added is preferably 35wt %.

The method for controlling firing shrinkage of the present invention is applicable to a production of a ceramic structure to be used for multilayered ceramic substrates, IC substrates, various kinds of sensors, actuators, radiators, oscillators, displays, microphones, speakers, filters, or the like.

Incidentally, a metallic powder may be used instead of a ceramic powder and can give a similar effect though a ceramic powder is used in the method for controlling firing shrinkage of the present invention.

The present invention is described in more detail with reference to Examples. However, the present invention is by no means limited to the Examples.

Example 1

Wet molding; green sheet

A partially stabilized zirconia powder (94.6 wt % of $ZrO_2$, 5.4 wt % of $Y_2O_3$, and 0.25 wt % of $Al_2O_3$ are contained.) was ground by a dry type attriter so that particles could pass through a stainless net having a distance od 500 μm between each mesh. The obtained powder had an Rs value of 0.167 μm. The obtained powder had an average degree of aggregation of 2.9.

A sagger made of mullite was filled with the obtained partially stabilized zirconia powder. The sagger was put in a furnace so as to be heat-treated under the condition shown in Table 3.

100 parts by volume of the powder after the heat treatment, 43.8 parts by volume of poly(vinyl butyral) resin, 21.7 parts by volume of dioctyl phthalate, 8.2 parts by volume of dispersing agent containing sorbitan fatty acid, 239.2 parts by volume of xylene, and 253 parts by volume of 1-butanol were put in a pot made of alumnina together with a ball made of zirconia. They were mixed by a ball mill for 24 hours.

The obtained slurry was subjected to a bubble-removing treatment. Then, using the slurry, a green sheet having a thickness of 200 μm after being dried was produced on a film of substrate made of poly(ethylene terephthalate) by a doctor blade molding machine.

A test piece of 26 mm ×60 mm was cut out from the obtained green sheet. The test piece was put in a furnace for firing and fired for 2 hours at 1450° C. in the air.

The obtained fired ceramic body was measured for three dimensions (a vertical dimension, a horizontal dimension, and a thickness), and calculative rates for firing in a vertical direction, a horizontal direction, and a direction of thickness were obtained. From the rates for firing, an average calculative rate for firing was obtained. The results are shown in Table 3. Incidentally, an average calculating rate was obtained using 6 test pieces for each of 6 heating temperatures.

Calculating rate in a vertical direction (A)=Vertical dimension before firing/Vertical dimension after firing Calculating rate in a horizontal direction (B)=Horizontal dimension before firing/Horizontal dimension after firing Calculating rate in a direction of thickness (C)=Dimension in a direction of thickness before firing/Dimension in a direction of thickness after firing Average calculating rate=(A+B+C)/3

Then, correlation between a heat-treating temperature and the average calculative rate was obtained by making a regression line of the secondary degree using data of heat-treating temperatures and average calculating rates shown in Table 3.

TABLE 3

| Rs(μm) | Kind of green body | Condition for thermal treatment | Average calculating rate |
|---|---|---|---|
| 0.167 | green sheet | 400° C. × 1 hr | 1.247 |
| " | " | 500° C. × 1 hr | 1.250 |
| " | " | 600° C. × 1 hr | 1.255 |
| " | " | 700° C. × 4 hr | 1.259 |
| " | " | 800° C. × 4 hr | 1.266 |
| " | " | 900° C. × 4 hr | 1.276 |

The following regression line of the secondary degree was obtained from the obtained correlation.

$$\text{Average calculation rate } (Y) = 7.68 \times 10^{-8} \times (t_0)^2 - 4.35 \times 10^{-5} \times t_0 + 1.2524$$

(Here, $t_0$ denotes a temperature for thermal treatment.)

Then, a target calculating rate was set to be 1.270±0.002 so as to obtain a temperature for thermal treatment for each of the samples from No. 1 to No. 20 shown in Table 4 from the above regression line of the secondary degree according to the description of Example 1 of U.S. Pat. No. 5,753,160. Each of the samples was subjected to a thermal treatment at a temperature obtained above, and then fired for 2 hours at a temperature shown in Table 4 to obtain a fired body. The fired bodies were measured for dimensions and evaluated regarding controllability as good for a fired body having dimensions within ±0.001 of the target calculating rate, fair for a fired body having dimensions within ±0.002 of the target calculating rate, and bad for a fired body having dimensions over ±0.002 of the target calculating rate, which are shown as ⊚, ○, and X, respectively, in Table 4.

As can be taken easily from the results shown in Table 4, a powder A which can not meet the requirements fails to show a good controllability of the shrinkage. For example, when the greatest content of components common between powder A and B is less than 90% by weight, such a powder shows a poor controllability (See Sample A Nos. 7 and 8). A similar thing is also applicable to the case when the ratio of the average degree of aggregation of powder A to powder B is not within of 1:2 to 2:1 (See Sample A No. 6).

Indeed, if the relative Rs value between powder A and power B is not within ±30%, only a poor controllability is attained (See Sample A No. 16). Sample A No. 13 is a case when the average degree of aggregation is outside the range from 2 to 10.

TABLE 4

| Sample number of powder A | Rs value (μm) | ADA* (Average Degree of aggregation) | Ratio of ADA* to ADA* of powder B | Composition of components | | | Greatest common content of common components (wt %) | Greatest common content of $ZrO_2$ and/or $Al_2O_3$ (wt %) | Firing temperature (kept for 2 Hrs.) | Judgement of controllability |
|---|---|---|---|---|---|---|---|---|---|---|
| | | | | $ZrO_2$ (wt %) | $Y_2O_3$ (wt %) | $Al_2O_3$ (wt %) | | | | |
| 1 | 0.167 | 2.9 | 1 | 93.89 | 5.11 | 1 | 99.25 | 94.14 | 1450° C. | ⊚ |
| 2 | 0.167 | 2.9 | 1 | 94.61 | 5.15 | 0.24 | 99.99 | 94.84 | 1450° C. | ⊚ |
| 3 | 0.215 | 5.8 | 2 | 94.59 | 5.15 | 0.26 | 99.99 | 94.84 | 1500° C. | ○ |
| 4 | 0.163 | 2.76 | 0.95 | 85.35 | 4.65 | 10 | 90.25 | 85.6 | 1450° C. | ○ |
| 5 | 0.152 | 4.35 | 1.5 | 85.35 | 4.65 | 10 | 90.25 | 85.6 | 1450° C. | ○ |
| 6 | 0.12 | 7 | 2.41 | 85.35 | 4.65 | 10 | 90.25 | 85.6 | 1400° C. | x |
| 7 | 0.21 | 2.1 | 0.72 | 75.87 | 4.13 | 20 | 80.25 | 76.12 | 1500° C. | x |
| 8 | 0.13 | 5.5 | 1.9 | 75.87 | 4.13 | 20 | 80.25 | 76.12 | 1400° C. | x |
| 9 | 0.183 | 2 | 0.69 | 90.1 | 4.9 | 5 | 95.25 | 90.35 | 1450° C. | ⊚ |
| 10 | 0.151 | 4.35 | 1.5 | 93.89 | 5.11 | 1 | 99.25 | 94.14 | 1450° C. | ⊚ |
| 11 | 0.167 | 2.9 | 1 | 90.1 | 4.9 | 5 | 95.25 | 90.35 | 1450° C. | ⊚ |
| 12 | 0.153 | 4.35 | 1.5 | 90.1 | 4.9 | 5 | 95.25 | 90.35 | 1450° C. | ⊚ |
| 13 | 0.21 | 1.65 | 0.57 | 85.35 | 4.65 | 10 | 90.25 | 85.6 | 1500° C. | x |
| 14 | 0.183 | 2 | 0.69 | 93.89 | 5.11 | 1 | 99.25 | 94.14 | 1450° C. | ⊚ |
| 15 | 0.167 | 2 | 0.69 | 85.35 | 4.65 | 10 | 90.25 | 85.6 | 1450° C. | ○ |
| 16 | 0.4 | 5.7 | 1.97 | 85.35 | 4.65 | 10 | 90.25 | 85.6 | 1600° C. | x |
| 17 | 0.117 | 3.5 | 1.21 | 90.1 | 4.9 | 5 | 95.25 | 90.35 | 1400° C. | ○ |
| 18 | 0.217 | 2.5 | 0.86 | 90.1 | 4.9 | 5 | 95.25 | 90.35 | 1500° C. | ○ |
| 19 | 0.18 | 5.7 | 1.97 | 90.1 | 4.9 | 5 | 95.25 | 90.35 | 1450° C. | ○ |
| 20 | 0.167 | 5.7 | 1.97 | 85.35 | 4.65 | 10 | 90.25 | 85.6 | 1450° C. | ○ |

ADA*: Average degree of aggregation

Example 2

A partially stabilized zirconia containing 94.6 wt % of $ZrO_2$, 5.15 wt % of $Y_2O_3$, and 0.25 wt % of $Al_2O_3$ was subjected to a grinding treatment in the same manner as in Example 1, and Rs value was controlled to be 0.067. Then, the powder was heat-treated under conditions shown in Table 5. As a result, this powder had an average degree of aggregation of 4.5.

A green sheet was produced in the same manner as in Example 1 except that 56.2 parts by volume of poly(vinyl butyral) resin, 20.0 parts by volume of dioctyl phthalate, 9 parts by volume of dispersing agent containing sorbitan fatty acid, 260.3 parts by volume of xylene, and 275.3 parts by volume of 1-butanol were put in a pot made of alumina together with a ball made of zirconia and that they were mixed by a ball mill for 30 hours.

The green sheet was fired in the same manner as in Example 1 to obtain a fired body. The fired body was measured for dimensions in the same manner as in Example 1 to obtain an average calculating rate at each temperature shown in Table 5. The results are shown in Table 5.

TABLE 5

| Rs($\mu$m) | Kind of green body | Condition for thermal treatment | Average calculating rate |
|---|---|---|---|
| 0.067 | green sheet | 400° C. × 1 hr | 1.273 |
| 0.067 | " | 500° C. × 1 hr | 1.278 |
| 0.067 | " | 600° C. × 1 hr | 1.285 |
| 0.067 | " | 700° C. × 4 hr | 1.293 |
| 0.067 | " | 800° C. × 4 hr | 1.303 |
| 0.067 | " | 900° C. × 4 hr | 1.315 |

The correlation between a heat-treating temperature and an average calculative rate on the basis of these values was obtained by preparing a regression line of the secondary degree by the use of the data shown in Table 5. From this correlation, the following regression curve of the secondary degree was obtained:

Average calculating rate $(Y)=8.39\times10^{-8}\times(t_0)^2-2.54\times10^{-5}\times t_0+1.2698$ Then, a target calculating rate was set to be 1.290±0.002 so as to obtain a temperature for thermal treatment for each of the samples from No. 1 to No. 14 shown in Table 6 from the above regression curve of the secondary degree according to the description of Example 1 of U.S. Pat. No. 5,753,160. Each of the samples was subjected to a thermal treatment at a temperature obtained above, and then fired for 2 hours at a temperature shown in Table 6 to obtain a fired body. The fired bodies were measured for dimensions and evaluated regarding controllability with the same criteria for evaluation as in Example 1. The results are shown in Table 6.

Again, when a ceramic powder sample A does not meet the requirements, it shows a poor shrinkage controllability (See Sample A No. 7 (less than 90% by weight in the greatest common content), Sample A No. 8 (less than the minimum relative average degree of aggregation) and Sample A No. 9 (exceeding the rate average degree of aggregation)).

Example 3

A partially stabilized zirconia containing 94.6 wt % of $ZrO_2$, 5.15 wt % of $Y_2O_3$, and 0.25 wt % of $Al_2O_3$ was subjected to a grinding treatment in the same manner as in Example 1, and Rs value was controlled to be 0.025. Then, the powder was heat-treated under conditions shown in Table 7. As a result, this powder had an average degree of aggregation of 7.5.

TABLE 7

| Conditions for heat treatment | Average calculating rate |
|---|---|
| 500° C. × 1 hr | 1.313 |
| 600° C. × 1 hr | 1.323 |
| 700° C. × 4 hr | 1.335 |

A green sheet was produced in the same manner as in Example 1 except that 66.0 parts by volume of poly(vinyl butyral) resin, 22.0 parts by volume of dioctyl phthalate, 11.0 parts by volume of dispersing agent containing sorbitan fatty acid, 281.4 parts by volume of xylene, and 287.7 parts by volume of 1-butanol were put in a pot made of alumina together with a ball made of zirconia and that they were mixed by a ball mill for 40 hours.

The green sheet was fired in the same manner as in Example 1 to obtain a fired body. The fired body was measured for dimensions in the same manner as in Example 1 to obtain an average calculating rate at each temperature shown in Table 7. The results are shown in Table 7.

The correlation between a heat-treating temperature and an average calculative rate on the basis of these values was obtained by preparing a regression line of the first degree by the use of the data shown in Table 7. From this correlation, the following regression line of the first degree was obtained.

Average calculating rate $(Y)=1.100\times10^{-4}\times(t_0)+1.2577$ (Here, $t_0$ denotes a temperature for thermal treatment.)

Then, a target calculating rate was set to be 1.290±0.002 so as to obtain a temperature for thermal treatment for each

TABLE 6

| Sample number of powder A | Rs value ($\mu$m) | ADA* (Average Degree of aggregation) | Ratio of ADA* to ADA* of powder B | Composition of components | | | | Greatest common content of common components (wt %) | Greatest common content of $ZrO_2$ and/or $Al_2O_3$ (wt %) | Firing temperature (kept for 2 Hrs.) | Judgement of controllability |
|---|---|---|---|---|---|---|---|---|---|---|---|
| | | | | $ZrO_2$ (wt %) | $Y_2O_3$ (wt %) | $Al_2O_3$ (wt %) | Others (wt %) | | | | |
| 1 | 0.067 | 4.5 | 1 | 93.89 | 5.11 | 1 | | 99.25 | 94.14 | 1400° C. | ⊚ |
| 2 | 0.07 | 6.7 | 1.49 | 94.84 | 5.16 | 0 | | 99.75 | 94.6 | 1400° C. | ⊚ |
| 3 | 0.073 | 2.3 | 0.51 | 93.89 | 5.11 | 1 | | 99.25 | 94.14 | 1400° C. | ○ |
| 4 | 0.071 | 6.7 | 1.49 | 90.1 | 4.9 | 5 | | 95.25 | 90.35 | 1400° C. | ⊚ |
| 5 | 0.074 | 3.1 | 0.69 | 85.35 | 4.65 | 10 | | 90.25 | 85.6 | 1400° C. | ○ |
| 6 | 0.055 | 9 | 2 | 85.35 | 4.65 | 10 | | 90.25 | 85.6 | 1400° C. | ○ |
| 7 | 0.049 | 6.7 | 1.49 | 75.87 | 4.13 | 20 | | 80.25 | 76.12 | 1400° C. | x |
| 8 | 0.086 | 2 | 0.44 | 85.35 | 4.65 | 10 | | 90.25 | 85.6 | 1400° C. | x |
| 9 | 0.05 | 10 | 2.22 | 85.35 | 4.65 | 10 | | 90.25 | 85.6 | 1400° C. | x |
| 10 | 0.067 | 4.5 | 1 | 90.1 | 4.90 | 3 | $SiO_2$: 2.2 | 95.25 | 90.35 | 1400° C. | ⊚ |
| 11 | 0.067 | 4.5 | 1 | 90.1 | 4.90 | 3 | MgO: 0.2 | 95.25 | 90.35 | 1400° C. | ⊚ |
| 12 | 0.067 | 4.5 | 1 | 92.75 | 7 | 0.25 | | 98.15 | 93 | 1400° C. | ⊚ |
| 13 | 0.07 | 4.8 | 1.07 | 89.43 | 10.32 | 0.25 | | 94.83 | 89.68 | 1400° C. | ○ |
| 14 | 0.073 | 5 | 1.11 | 86.13 | 13.62 | 0.25 | | 91.53 | 86.38 | 1400° C. | ○ |

ADA*: Average degree of aggregation of the samples from No. 1 to No. 17 shown in Table 8 from the above regression line of the first degree according to the description of Example 1 of U.S. Pat. No. 5,753,160. Each of the samples was subjected to a thermal treatment at a temperature obtained above, and then fired for 2 hours at a temperature shown in Table 8 to obtain a fired body. The fired bodies were measured for dimensions and evaluated regarding controllability with the same criteria for evaluation as in Example 1. The results are shown in Table 8.

Again, when a ceramic powder sample A does not meet the requirements, it shows a poor shrinkage controllability (See Sample A Nos. 2 and 5 (average degree of aggregation), Sample A Nos. 7 and 8 (greatest common content), Sample A No. 9 (relative Rs value) and Sample A No. 17 (relative degree of aggregation)).

volume of 1-butanol were put in a pot made of alumina together with a ball made of zirconia and that they were mixed by a ball mill for 24 hours.

The green sheet was fired in the same manner as in Example 1 to obtain a fired body. The fired body was measured for dimensions in the same manner as in Example 1 to obtain an average calculating rate a each temperature shown in Table 9. The results are shown in Table 9.

The correlation between a heat-treating temperature and an average calculative rate on the basis of these values was obtained by preparing a regression line of the secondary degree by the use of the data shown in Table 9. From this correlation, the following regression curve of the secondary degree was obtained.

TABLE 8

| Sample number of powder A | Rs value ($\mu$m) | ADA* (Average Degree of aggregation) | Ratio of ADA* to ADA* of powder B | Composition of components | | | Greatest common content of common components (wt %) | Maximum common content of $ZrO_2$ and/or $Al_2O_3$ (wt %) | Firing temperature (kept for 2 Hrs.) | Judgement of controllability |
|---|---|---|---|---|---|---|---|---|---|---|
| | | | | $ZrO_2$ (wt %) | $Y_2O_3$ (wt %) | $Al_2O_3$ (wt %) | | | | |
| 1 | 0.025 | 7.5 | 1 | 93.89 | 5.11 | 1 | 99.25 | 94.14 | 1350° C. | ◉ |
| 2 | 0.018 | 50 | 6.67 | 94.61 | 5.15 | 0.24 | 99.99 | 94.84 | 1350° C. | x |
| 3 | 0.019 | 3.8 | 0.51 | 94.59 | 5.15 | 0.26 | 99.99 | 94.84 | 1350° C. | ○ |
| 4 | 0.026 | 7.5 | 1 | 85.35 | 4.65 | 10 | 90.25 | 85.6 | 1350° C. | ○ |
| 5 | 0.018 | 15 | 2 | 85.35 | 4.65 | 10 | 90.25 | 85.6 | 1350° C. | x |
| 6 | 0.024 | 10 | 1.33 | 85.35 | 4.65 | 10 | 90.25 | 85.6 | 1350° C. | ○ |
| 7 | 0.031 | 5.1 | 0.68 | 75.87 | 4.13 | 20 | 80.25 | 76.12 | 1350° C. | x |
| 8 | 0.019 | 10 | 1.33 | 75.87 | 4.13 | 20 | 80.25 | 76.12 | 1350° C. | x |
| 9 | 0.13 | 5.1 | 0.68 | 85.35 | 4.65 | 10 | 90.25 | 85.6 | 1350° C. | x |
| 10 | 0.024 | 10 | 1.33 | 93.89 | 5.11 | 1 | 99.25 | 94.14 | 1350° C. | ◉ |
| 11 | 0.027 | 5.1 | 0.68 | 93.89 | 5.11 | 1 | 99.25 | 94.14 | 1350° C. | ◉ |
| 12 | 0.02 | 3.8 | 0.51 | 93.89 | 5.11 | 1 | 99.25 | 94.14 | 1350° C. | ○ |
| 13 | 0.024 | 10 | 1.33 | 90.1 | 4.9 | 5 | 95.25 | 90.35 | 1350° C. | ◉ |
| 14 | 0.027 | 5.1 | 0.68 | 90.1 | 4.9 | 5 | 95.25 | 90.35 | 1350° C. | ◉ |
| 15 | 0.031 | 7.5 | 1 | 90.1 | 4.9 | 5 | 95.25 | 90.35 | 1350° C. | ○ |
| 16 | 0.025 | 3.8 | 0.51 | 85.35 | 4.65 | 10 | 90.25 | 85.6 | 1350° C. | ○ |
| 17 | 0.032 | 3 | 0.4 | 85.35 | 4.65 | 10 | 90.25 | 85.6 | 1350° C. | x |

ADA*: Average degree of aggregation

Example 4

An alumina powder containing 96.0 wt % of $Al_2O_3$, 2 wt % of MgO, and 2 wt % of $SiO_2$ was subjected to a grinding treatment in the same manner as in Example 1, and Rs value was controlled to be 0.15 $\mu$m. Then, the powder was heat-treated under conditions shown in Table 9. As a result, this powder had an average degree of aggregation of 3.5.

TABLE 9

| Conditions for heat treatment | Average calculating rate |
|---|---|
| 400° C. × 1 hr | 1.230 |
| 500° C. × 1 hr | 1.234 |
| 600° C. × 1 hr | 1.239 |
| 700° C. × 4 hrs | 1.244 |
| 800° C. × 4 hrs | 1.250 |
| 900° C. × 4 hrs | 1.256 |

A green sheet was produced in the same manner as in Example 1 except that 42.3 parts by volume of poly(vinyl butyral) resin, 18.2 parts by volume of dioctyl phthalate, 8.2 parts by volume of dispersing agent containing sorbitan fatty acid, 225.1 parts by volume of xylene, and 238.1 parts by Average calculating rate $(Y)=2.5\times10^{-8}\times(t_0)^2+1.9786\times10^{-5}\times t_0+1.218$ (Here, $t_0$ denotes a temperature for thermal treatment.)

Then, a target calculating rate was set to be 1.240±0.002 so as to obtain a temperature for thermal treatment for each of the samples from No. 1 to No. 6 shown in Table 10 from the above regression curve of the secondary degree according to the description of Example 1 of U.S. Pat. No. 5,753,160. Each of the samples was subjected to a thermal treatment at a temperature obtained above, and then fired for 2 hours at a temperature shown in Table 10 to obtain a fired body. The fired bodies were measured for dimensions shown in Table 10 to obtain a fired body. The fired were measured for dimensions and evaluated regarding controllability with the same criteria for evaluation as in Example 1. The results are shown in Table 10.

Again, Sample A powders which can not satisfy the requirements show a poor controllability; relative Rs value (Sample A No. 4), relative average degree of aggregation (Sample A No. 5) and greatest common content (Sample A No. 6).

TABLE 10

| Sample number of powder A | Rs value (μm) | ADA* (Average Degree of aggregation) | Ratio of ADA* to ADA* of powder B | Composition of components | | | Greatest common content of common components (wt %) | Greatest common content of ZrO$_2$ and/or Al$_2$O$_3$ (wt %) | Firing temperature (kept for 2 Hrs.) | Judgement of controllability |
|---|---|---|---|---|---|---|---|---|---|---|
| | | | | ZrO$_2$ (wt %) | MgO (wt %) | SiO$_2$ (wt %) | | | | |
| 1 | 0.165 | 3.1 | 0.89 | 94.5 | 2 | 3.5 | 98.5 | 94.5 | 1500° C. | ⊚ |
| 2 | 0.11 | 2.3 | 0.66 | 96 | 2.5 | 1.5 | 99.5 | 96 | 1500° C. | ○ |
| 3 | 0.135 | 5.2 | 1.49 | 90 | 5 | 5 | 94 | 90 | 1500° C. | ○ |
| 4 | 0.07 | 6.2 | 1.77 | 98 | 1 | 1 | 98 | 96 | 1500° C. | x |
| 5 | 0.105 | 8.05 | 2.3 | 91 | 4.5 | 4.5 | 95 | 91 | 1500° C. | x |
| 6 | 0.12 | 6.5 | 1.86 | 84 | 8 | 8 | 88 | 84 | 1500° C. | x |

ADA*: Average degree of aggregation

Example 5

A partially stabilized zirconia containing 94.6 wt % of ZrO$_2$, 5.15 wt % of Y$_2$O$_3$, and 0.25 wt % of Al$_2$O$_3$ was subjected to a grinding treatment in the same manner as in Example 1, and Rs value was controlled to be 0.24 μm. Then, the powder was heat-treated under conditions shown in Table 11. As a result, this powder had an average degree of aggregation of 3.1.

TABLE 11

| Conditions for heat treatment | Average calculating rate |
|---|---|
| 700° C. × 4 hr | 1.256 |
| 800° C. × 4 hr | 1.261 |

A green sheet was produced in the same manner as in Example 1 except that 51.5 parts by volume of poly(vinyl butyral) resin, 22.7 parts by volume of dioctyl phthalate, 5.5 parts by volume of dispersing agent containing sorbitan fatty acid, 246.2 parts by volume of xylene, and 260.5 parts by volume of 1-butanol were put in a pot made of alumina together with a ball made of zirconia and that they were mixed by a ball mill for 24 hours.

The green sheet was fired in the same manner as in Example 1 to obtain a fired body. The fired body was measured for dimensions in the same manner as in Example 1 to obtain an average calculating rate at each temperature shown in Table 11. The results are shown in Table 11.

The correlation between a heat-treating temperature and an average calculative rate on the basis of these values was obtained by preparing a correlation line of the first degree by the use of the data shown in Table 11. From this correlation, the following correlation line of the first degree was obtained:

Average calculating rate $(Y)=0.5000\times10^{-4}\times(t_0)+1.2210$ (Here, $t_0$ denotes a temperature for thermal treatment.)

Then, a target calculating rate was set to be 1.260±0.002 so as to obtain a temperature for thermal treatment for each of the samples from No. 1 to No. 13 shown in Table 12 from the correlation line of the first degree according to the description of Example 1 of U.S. Pat. No. 5,753,160. Each of the sample was subjected to a thermal treatment at a temperature obtained above, and then fired for 2 hours at a temperature shown in Table 12 to obtain a fired body. The fired bodies were measured for dimensions and evaluated regarding controllability with the same criteria for evaluation as in Example 1. The results are shown in Table 12.

A poor shrinkage controllability is observed when ceramic powders do not satisfy the requirements: Sample A No. 3; relative average degree of aggregation, and Sample A Nos. 9 and 10: greatest common content.

TABLE 12

| Sample number of powder A | Rs value (μm) | ADA* (Average Degree of aggregation) | Ratio of ADA* to ADA* of powder B | Composition of components | | | Greatest common content of common components (wt %) | Greatest common content of ZrO$_2$ and/or Al$_2$O$_3$ (wt %) | Firing temperature (kept for 2 Hrs.) | Judgement of controllability |
|---|---|---|---|---|---|---|---|---|---|---|
| | | | | ZrO$_2$ (wt %) | Y$_2$O$_3$ (wt %) | Al$_2$O$_3$ (wt %) | | | | |
| 1 | 0.24 | 3.1 | 1 | 94.84 | 5.16 | 0.00 | 99.75 | 94.60 | 1500° C. | ⊚ |
| 2 | 0.24 | 3.1 | 1 | 94.74 | 5.16 | 0.10 | 99.85 | 94.70 | 1500° C. | ⊚ |
| 3 | 0.169 | 7.7 | 2.48 | 94.61 | 5.15 | 0.24 | 99.99 | 94.84 | 1450° C. | x |
| 4 | 0.29 | 5.7 | 1.84 | 94.59 | 5.15 | 0.26 | 99.99 | 94.84 | 1550° C. | ○ |
| 5 | 0.24 | 3.1 | 1 | 94.36 | 5.14 | 0.50 | 99.75 | 94.61 | 1500° C. | ⊚ |
| 6 | 0.24 | 3.1 | 1 | 93.89 | 5.11 | 1.00 | 99.25 | 94.14 | 1500° C. | ⊚ |
| 7 | 0.24 | 3.1 | 1 | 90.10 | 4.90 | 5.00 | 95.25 | 90.35 | 1500° C. | ⊚ |
| 8 | 0.24 | 3.1 | 1 | 85.35 | 4.65 | 10.00 | 90.25 | 85.60 | 1500° C. | ○ |
| 9 | 0.24 | 3.1 | 1 | 75.87 | 4.13 | 20.00 | 80.25 | 76.12 | 1500° C. | x |
| 10 | 0.24 | 3.1 | 1 | 56.90 | 3.10 | 40.00 | 60.25 | 57.15 | 1500° C. | x |
| 11 | 0.24 | 3.1 | 1 | 92.75 | 7.00 | 0.25 | 98.15 | 93.00 | 1500° C. | ⊚ |
| 12 | 0.24 | 3.1 | 1 | 89.43 | 10.32 | 0.25 | 94.83 | 89.68 | 1500° C. | ○ |
| 13 | 0.24 | 3.1 | 1 | 86.13 | 13.62 | 0.25 | 91.53 | 86.38 | 1500° C. | ○ |

ADA*: Average degree of aggregation

Example 6

A zirconia powder containing 79 wt % of $ZrO_2$, 4 wt % of $Y_2O_3$, 0 wt % of $Al_2O_3$ and 17 wt % of $CeO_2$ was subjected to a grinding treatment in the same manner as in Example 1, and Rs value was controlled to be 0.4 μm. Then, the power was heat-treated under conditions shown in Table 13. As a result, this powder had an average degree of aggregation of 2.5.

TABLE 13

| Conditions for heat treatment | Average calculating rate |
|---|---|
| 500° C. × 1 hr | 1.217 |
| 600° C. × 1 hr | 1.218 |
| 700° C. × 4 hrs | 1.221 |
| 800° C. × 4 hrs | 1.225 |
| 900° C. × 4 hrs | 1.230 | a green sheet was produced in the same manner as in Example 1 except that 42.0 parts by volume of poly(vinyl butyral) resin, 17.7 parts by volume of dioctyl phthalate, 5.5 parts by volume of dispersing agent containing sorbitan fatty acid, 211.0 parts by volume of xylene, and 223.2 parts by volume of 1-butanol were put in a pot made of alumina together with a ball made of zirconia and that they were mixed by a ball mill for 20 hours.

The green sheet was fired in the same manner as in Example 1 to obtain a fired body. The fired body was measured for dimensions in the same manner as in Example 1 to obtain an average rate at each temperature shown in Table 13. The results are shown in Table 13.

The correlation between a heat-treating temperature and an average calculative rate on the basis of these values was obtained by preparing a regression line of the secondary degree by the use of the data shown in Table 13. From this correlation, the following regression curve of the secondary degree was obtained:

Average calculating rate $(Y)=6.429\times10^{-8}\times(t_0)^2-5.7\times10^{-5}\times t_0+1.2293$ (Here, $t_0$ denotes a temperature for thermal treatment.)

Then, a target calculating rate was set to be 1.220±0.0002 so as to obtain a temperature for thermal treatment for each of the samples from No. 1 No. 11 shown in Table 14 from the above regression curve of the secondary degree according to the description of Example 1 of U.S. Pat. No. 5,753,160. Each of the samples was subjected to a thermal treatment at a temperature obtained above, and then fired for 2 hours at a temperature shown in Table 14 to obtain a fired body. The fired bodies were measured for dimensions and evaluated regarding controllability with the same criteria for evaluation as in Example 1. The results are shown in Table 14.

When the greatest common content of the common components is not within the range of 90% by weight or more, a good shrinkage controllability is not attained as is clear from Sample A No. 11.

TABLE 14

| Sample number of powder A | Rs value (μm) | ADA* (average degree of aggregation) | Ratio of of ADA* to ADA* of powder B | Composition of components | | | | Greatest common content of common components (wt %) | Greatest common content of $ZrO_2$ and/or $Al_2O_3$ (wt %) | Firing temperature (kept for 2 Hrs.) | Judgement of controllability |
|---|---|---|---|---|---|---|---|---|---|---|---|
| | | | | $Al_2O_3$ (wt %) | $ZrO_2$ (wt %) | $Y_2O_3$ (wt %) | $CeO_2$ (wt %) | | | | |
| 1 | 0.36 | 2.7 | 1.08 | 0 | 84.8 | 4.4 | 10.8 | 93.8 | 79 | 1600° C. | ○ |
| 2 | 0.33 | 3 | 1.2 | 10 | 76.32 | 3.96 | 9.72 | 90 | 76.32 | 1600° C. | ○ |
| 3 | 0.44 | 2 | 0.8 | 5 | 74.8 | 3.8 | 16.4 | 95 | 74.8 | 1600° C. | ○ |
| 4 | 0.4 | 2.5 | 1 | 0 | 79.6 | 4.4 | 16 | 99 | 79 | 1600° C. | ◎ |
| 5 | 0.35 | 2.9 | 1.16 | 5 | 75.62 | 4.18 | 15.2 | 94.82 | 75.62 | 1600° C. | ○ |
| 6 | 0.37 | 3.1 | 1.24 | 10 | 71.64 | 3.96 | 14.4 | 90 | 71.64 | 1600° C. | ○ |
| 7 | 0.4 | 2.5 | 1 | 0 | 84 | 0 | 16 | 95 | 79 | 1600° C. | ◎ |
| 8 | 0.33 | 3 | 1.2 | 10 | 75.6 | 0 | 14.4 | 90 | 75.6 | 1600° C. | ○ |
| 9 | 0.39 | 2.5 | 1 | 0 | 79 | 0 | 21 | 96 | 79 | 1600° C. | ◎ |
| 10 | 0.41 | 2.3 | 0.92 | 5 | 75.05 | 0 | 19.95 | 92.05 | 75.05 | 1600° C. | ○ |
| 11 | 0.51 | 2 | 0.8 | 20 | 63.2 | 0 | 16.8 | 80 | 63.2 | 1600° C. | x |

ADA*: Average degree of aggregation

As described above, it is not necessary to obtain correlation by adjusting, molding, firing, etc., a powder B for obtaining a correlation which has the same composition as a powder A to be controlled as long as the powders A and B have similar compositions, a total content of the common components is 90 wt % or more, each of the powders A and B has Rs of 1 μm or less, Rs of the powder A is within ±30% of that of the powder B, each of the powders A and B has an average degree of aggregation within the range from 2 to 10, and an average degree of aggregation of the powder A is within the range from ½ fold to 2 fold relative to that of the powder B. Thus, according to the present invention, ceramic powders having such a correlation are subjected to a thermal treatment at a specific temperature, and then molded and fired. This enables to provide a method which can control a firing shrinkage of a ceramic green body simply and precisely without having defects in shape, or the like, in the fired body and which can intentionally control a shape of the fired body in a multi-layer ceramic substrate system, or the like.

What is claimed is:

1. A method of preparing a fired ceramic powder body, comprising the steps of:

(i) molding a ceramic powder (A) having a spherical diameter (Rs) of 1 μm or less wherein said spherical diameter (Rs) is expressed by an equation $$Rs\ (\mu m) = 6/\rho s$$

in which ρ is a true density (g/cm³) of a powder, and S is a BET specific surface area of a powder, and an average degree of aggregation ($\underline{x}$) of 2 to 10 wherein said average degree of aggregation ($\underline{x}$) is expressed by an equation $$\underline{x} = Rm/Rs$$

in which Rm is a radian diameter observed by a laser scattering method and Rs is a spherical diameter as defined above;

(ii) firing the green body at a predetermined firing temperature; said method further comprising controlling the amount of firing shrinkage during the firing step (ii) to a desired value $A_1$ by heat treating said powder at a temperature $T_1$ that provides said firing shrinkage $A_1$ at said predetermined firing temperature, said temperature $T_1$ being determined based on an established correlation between an amount of firing shrinkage at said predetermined firing temperature and a heat-treatment temperature, said correlation being obtained by the steps ob (a) subjecting samples of a powder (B) having a spherical diameter (Rs) of 1 μm or less and an average degree of aggregation ($\underline{x}$) of 2 to 10 to heat treatment before molding respectively at least two different temperatures; said powder (A) having a composition similar to a composition of said powder (B) in such an extent that a total amount of a greatest common content of an individual component common between said powders (A) and (B) in terms of percent is 90% by weight or more, and satisfying such a relation that its spherical diameter is within a range of ±30% relative to said spherical diameter (Rs) of said powder (B) and that its average degree of aggregation ($\underline{x}$) is within the range from ½ fold to 2 fold relative to said average degree of aggregation ($\underline{x}$) of said powder (B), and then molding the samples and firing them at said predetermined firing temperatures to obtain firing shrinkage values corresponding to said at least two heat-treatment temperatures, and thereby obtaining a regression line for the correlation between the heat-treatment temperature and the firing shrinkage, (b) subjecting a portion of said powder (A) to be molded in step (i), to heat-treatment before molding at one temperature and molding it and firing it as said predetermined firing temperature to obtain a firing shrinkage value corresponding to said one heat-treatment temperature, and (c) on the basis of the firing shrinkage value obtained in step (b) and the regression line obtained in step (a), establishing said correlation for said powder to be molded in step (i) by assuming that its regression line for the relationship between heat-treatment temperature and firing shrinkage in a graph plotting the regression lines, with respect to the regression line obtained in step (a).

2. A method according to claim 1, wherein said components of both powders (A) and (B) include at least one of $Al_2O_3$ and $ZrO_2$, respectively, and a total amount of a greatest content of said $Al_2O_3$ and $ZrO_2$ common to said powders (A) and (B) is 75% by weight or more.

3. A method according to claim 1, wherein said average degree of aggregation ($\underline{x}$) of said powder (B) is within a range of ⅜ fold to ⅔ fold relative to said average degree of aggregation ($\underline{x}$) of said powder (A) to be molded.

* * * * *